United States Patent
Yanagishima et al.

(10) Patent No.: US 10,109,995 B2
(45) Date of Patent: Oct. 23, 2018

(54) SWITCH DRIVE CIRCUIT

(71) Applicant: Rohm Co., Ltd., Kyoto (JP)

(72) Inventors: Daiki Yanagishima, Kyoto (JP); Chinatsu Nakaoka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 378 days.

(21) Appl. No.: 15/042,870

(22) Filed: Feb. 12, 2016

(65) Prior Publication Data
US 2016/0248243 A1 Aug. 25, 2016

(30) Foreign Application Priority Data

Feb. 24, 2015 (JP) ................. 2015-033819

(51) Int. Cl.
| | | |
|---|---|---|
| H02H 7/00 | (2006.01) | |
| H02H 3/087 | (2006.01) | |
| H02H 3/093 | (2006.01) | |
| H03K 17/081 | (2006.01) | |
| H03K 17/082 | (2006.01) | |
| H02H 3/027 | (2006.01) | |
| H03K 17/16 | (2006.01) | |

(52) U.S. Cl.
CPC ............ *H02H 3/087* (2013.01); *H02H 3/093* (2013.01); *H03K 17/0828* (2013.01); *H03K 17/08116* (2013.01); *H03K 17/168* (2013.01); *H02H 3/027* (2013.01); *H03K 17/166* (2013.01)

(58) Field of Classification Search
USPC ......................................... 361/18
See application file for complete search history.

(56) References Cited

U.S. PATENT DOCUMENTS

| | | | | |
|---|---|---|---|---|
| 5,898,554 | A * | 4/1999 | Schnetzka | H03K 17/0828 323/276 |
| 9,490,794 | B1 * | 11/2016 | Zhang | H03K 17/0828 |
| 9,531,377 | B2 * | 12/2016 | Yamamoto | F02P 3/055 |
| 9,564,818 | B2 * | 2/2017 | Shinozaki | H02M 1/36 |
| 2004/0011343 | A1 * | 1/2004 | Nobe | F02P 3/0435 123/644 |

(Continued)

FOREIGN PATENT DOCUMENTS

| | | |
|---|---|---|
| JP | 2014-093836 | 5/2014 |
| JP | 2014-529239 | 10/2014 |

*Primary Examiner* — Ronald W Leja
(74) *Attorney, Agent, or Firm* — Fish & Richardson P.C.

(57) ABSTRACT

A switch drive circuit for driving a switching device includes an overcurrent detector which detects an overcurrent passing through the switching device, and a voltage controller which applies a control voltage to the switching device to control the switching device between On and Off states. When the overcurrent detector detects an overcurrent, the voltage controller applies to the switching device a control voltage that initially drops to a predetermined voltage higher than the threshold voltage of the switching device and that then, after the lapse of a predetermined time, drops further to the ground potential of the switch drive circuit to turn off the switching device. When the overcurrent detector detects no overcurrent, the voltage controller applies to the switching device a control voltage that drops, before the lapse of the predetermined voltage, to the ground potential of the switch drive circuit to turn off the switching device.

11 Claims, 8 Drawing Sheets

(56) References Cited

U.S. PATENT DOCUMENTS

| | | | |
|---|---|---|---|
| 2011/0051296 A1* | 3/2011 | Ando | H03K 17/0822 |
| | | | 361/18 |
| 2013/0049843 A1 | 2/2013 | Jorge et al. | |
| 2015/0035585 A1 | 2/2015 | Mari Curbelo et al. | |
| 2015/0180453 A1 | 6/2015 | Mori | |
| 2015/0381170 A1* | 12/2015 | Yamamoto | F02P 3/055 |
| | | | 327/109 |
| 2016/0248243 A1* | 8/2016 | Yanagishima | H02H 3/087 |
| 2016/0352320 A1* | 12/2016 | Nagase | H02M 1/32 |
| 2017/0187319 A1* | 6/2017 | Ozawa | H02H 3/0935 |
| 2017/0288385 A1* | 10/2017 | Naka | H02H 3/08 |

\* cited by examiner

SWITCH DRIVE CIRCUIT

This application is based on Japanese Patent Application No. 2015-033819 filed on Feb. 24, 2015, the contents of which are hereby incorporated by reference.

BACKGROUND OF THE INVENTION

1. Field of the Invention

The present invention relates to switch drive circuits.

2. Description of Related Art

Conventionally, a technology has been developed to suppress a surge voltage (instantaneous spike voltage) that occurs when a switching device such as an IGBT (insulated-gate bipolar transistor) turns off.

This technology will be described specifically with reference to FIGS. 6 to 8. Suppose that, as shown in FIG. 6, a gate driver 100 drives a gate of a switching device Q1 which is an IGBT.

In the configuration shown in FIG. 6, as shown in a timing chart in FIG. 7, in a case where, when the switching device Q1 turns off, a gate-emitter voltage Vge of the switching device Q1 is controlled so as to drop to the ground potential of the gate driver 100, the collector-emitter voltage Vce of the switching device Q1 may instantaneously rise up to a high voltage, causing a surge voltage. Here, the collector current Ice, which has been high with the switching device Q1 on, drops to zero. As described above, when the switching device Q1 turns off, a surge voltage may occur. In particular, when the collector current Ice is a large current, the surge voltage may exceed the withstand voltage of the switching device Q1, destroying the switching device Q1.

As a solution, conventionally, as shown in FIG. 8, when the switching device Q1 turns off, the gate-emitter voltage Vge of the switching device Q1 is controlled so as to drop initially to a voltage Vm higher than the threshold voltage Vt and then, after the lapse of a predetermined time, further to the ground potential of the gate driver 100. This helps suppress an instantaneous rise up to a high voltage in the collector-emitter voltage Vce of the switching device Q1, thus preventing a surge voltage from exceeding the withstand voltage of the switching device Q1.

One example of conventional technology related to the above description can be found in JP-A-2014-093836 and JP-A-2014-529239.

However, as will be understood from an overlap, indicated by hatching in FIG. 8, between the collector current Ice and the collector-emitter voltage Vce, a configuration that suppresses a rise due to a surge voltage when the switching device Q1 turns off suffers from a large switching loss. As a result, inconveniently, both in the control shown in FIG. 7 and in regular operation in which no surge voltage exceeding the withstand voltage of the switching device Q1 occurs when it turns off, a large switching loss occurs.

SUMMARY OF THE INVENTION

Devised against the background discussed above, an object of the present invention is to provide a switch drive circuit that can suppress, on occurrence of an overcurrent, a rise due to a surge voltage when a switching device turns off, and that can suppress, in normal operation, a switching loss.

According to one aspect of the present invention, a switch drive circuit for driving a switching device includes an overcurrent detector which detects an overcurrent passing through the switching device, and a voltage controller which applies a control voltage to the switching device to control the switching device between On and Off states. When the overcurrent detector detects an overcurrent, the voltage controller applies to the switching device a control voltage that initially drops to a predetermined voltage higher than the threshold voltage of the switching device and that then, after the lapse of a predetermined time, drops further to the ground potential of the switch drive circuit to turn off the switching device. When the overcurrent detector detects no overcurrent, the voltage controller applies to the switching device a control voltage that drops, before the lapse of the predetermined voltage, to the ground potential of the switch drive circuit to turn off the switching device.

DETAILED DESCRIPTION OF PREFERRED EMBODIMENTS

An embodiment of the present invention will be described below with reference to the accompanying drawings. The circuit configuration of a gate driver (switch drive circuit) according to one embodiment of the present invention is shown in FIG. 1.

Figure 1:
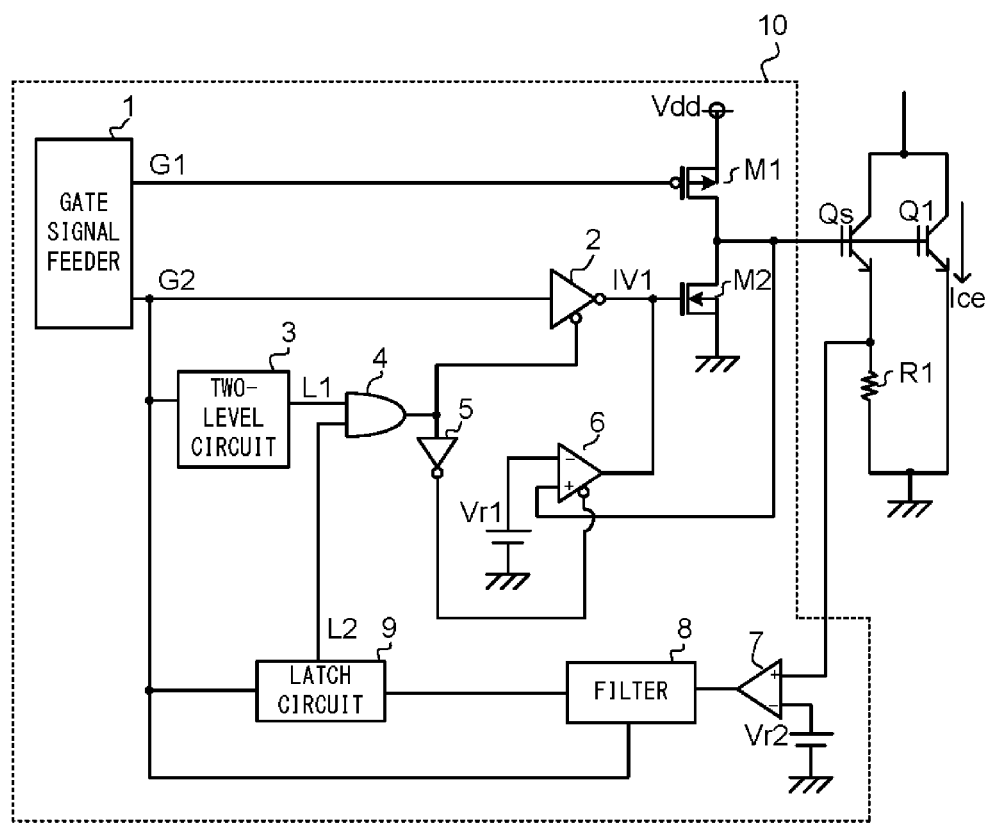
FIG. 1 is a diagram showing a circuit configuration of a gate driver according to one embodiment of the present invention.

The gate driver 10 shown in FIG. 1 includes a gate signal feeder 1, a three-state inverter 2, a two-level circuit 3, an AND circuit 4, an inverter 5, an error amplifier 6, a comparator 7, a filter 8, a latch circuit 9, a MOS transistor M1, and a MOS transistor M2. The gate driver 10 is thus configured as an integrated circuit (IC).

Between a supply voltage Vdd and a ground potential, the p-channel MOS transistor M1, which is arranged on an upper side, and the n-channel MOS transistor M2, which is arranged on a lower side, are connected in series, thereby constituting a bridge.

The gate signal feeder 1 (drive signal feeder) outputs a first gate signal G1 to a gate of the MOS transistor M1, and outputs a second gate signal G2 via the three-state inverter 2 to a gate of the MOS transistor M2.

The three-state inverter 2 is a circuit that switches, according to a control signal applied to a control terminal thereof, between a state (enabled state) in which it inverts an input signal and then outputs the result and a state in which it keeps its output impedance high. To an input terminal of the three-state inverter 2, the second gate signal G2 is fed from the gate signal feeder 1, and to the output side of the inverter 2, the gate of the MOS transistor M2 is connected.

The two-level circuit 3 is fed with the second gate signal G2 from the gate signal feeder 1. The two-level circuit 3 is a circuit that basically outputs a low level and that, when the second gate signal G2 turns from high level to low level, outputs a pulse signal which is kept at high level for a predetermined time.

One input terminal of the AND circuit 4 is fed with the output of the two-level circuit 3 is, and another input terminal of the AND circuit 4 is fed with the output of the latch circuit 9. An output terminal of the AND circuit 4 is connected to the control terminal of the three-state inverter 2 and to an input terminal of the inverter 5.

The output of the inverter 5 is fed to a control terminal of the error amplifier 6. The error amplifier 6 switches, according to a control signal applied to the control terminal thereof, between a state (enabled state) in which it outputs the amplified signal of the difference between two input signals and a state in which it keeps its output impedance high. To a non-inverting input terminal of the error amplifier 6, a node between the MOS transistors M1 and M2 is connected, and to an inverting input terminal of the error amplifier 6, a reference voltage Vr1 is applied. An output terminal of the error amplifier 6 is connected to the gate of the MOS transistor M2.

With this configuration, when the error amplifier 6 is in the enabled state, the error amplifier 6 drives the gate of the MOS transistor M2 according to the difference between the voltage at the node between the MOS transistors M1 and M2 and the reference voltage Vr1, and thereby the voltage at the above mentioned node is controlled so as to be equal to the reference voltage Vr1.

The node between the MOS transistors M1 and M2 is connected to a gate of a switching device Q1 comprising an IGBT which is a driving target of the gate driver 10 and to a gate of a switching device Qs comprising an IGBT. The switching device Q1 is connected in parallel with a circuit segment comprising the switching device Qs and a resistor R1 connected in series. The switching device Qs and the resistor R1 are for detecting the collector current Ice passing through the switching device Q1. Through the switching device Qs, a mirror current passes which equals, for example, about one thousandth of the collector current Ice passing through the switching device Q1, and the mirror current is converted into a voltage serving as a current detection signal by the resistor R1.

The above mentioned current detection signal is fed to a non-inverting input terminal of the comparator 7, and a reference voltage Vr2 is applied to an inverting input terminal of the comparator 7. The output of the comparator 7 is fed via the filter 8 to the latch circuit 9. The filter 8 is fed with the output of the comparator 7 and with the second gate signal G2. The latch circuit 9 is fed with the output of the filter 8 and with the second gate signal G2. The output of the latch circuit 9 is fed to one input terminal of the AND circuit 4. The comparator 7, the filter 8, and the latch circuit 9 constitute an overcurrent detector. The operation of the filter 8 and the latch circuit 9 will be described in detail later. The gate signal feeder 1, the three-state inverter 2, the two-level circuit 3, the AND circuit 4, the inverter 5, the error amplifier 6, and the MOS transistor M2 constitute an example of a voltage controller according to the present invention.

Next, how the switching device Q1 is driven and controlled by the gate driver 10 configured as described above will be described with reference to timing charts shown in FIGS. 2 and 3.

First, a description will be given with reference to FIG. 2. The timing chart there shows a case where an overcurrent occurs in the collector current Ice of the switching device Q1.

Figure 2:
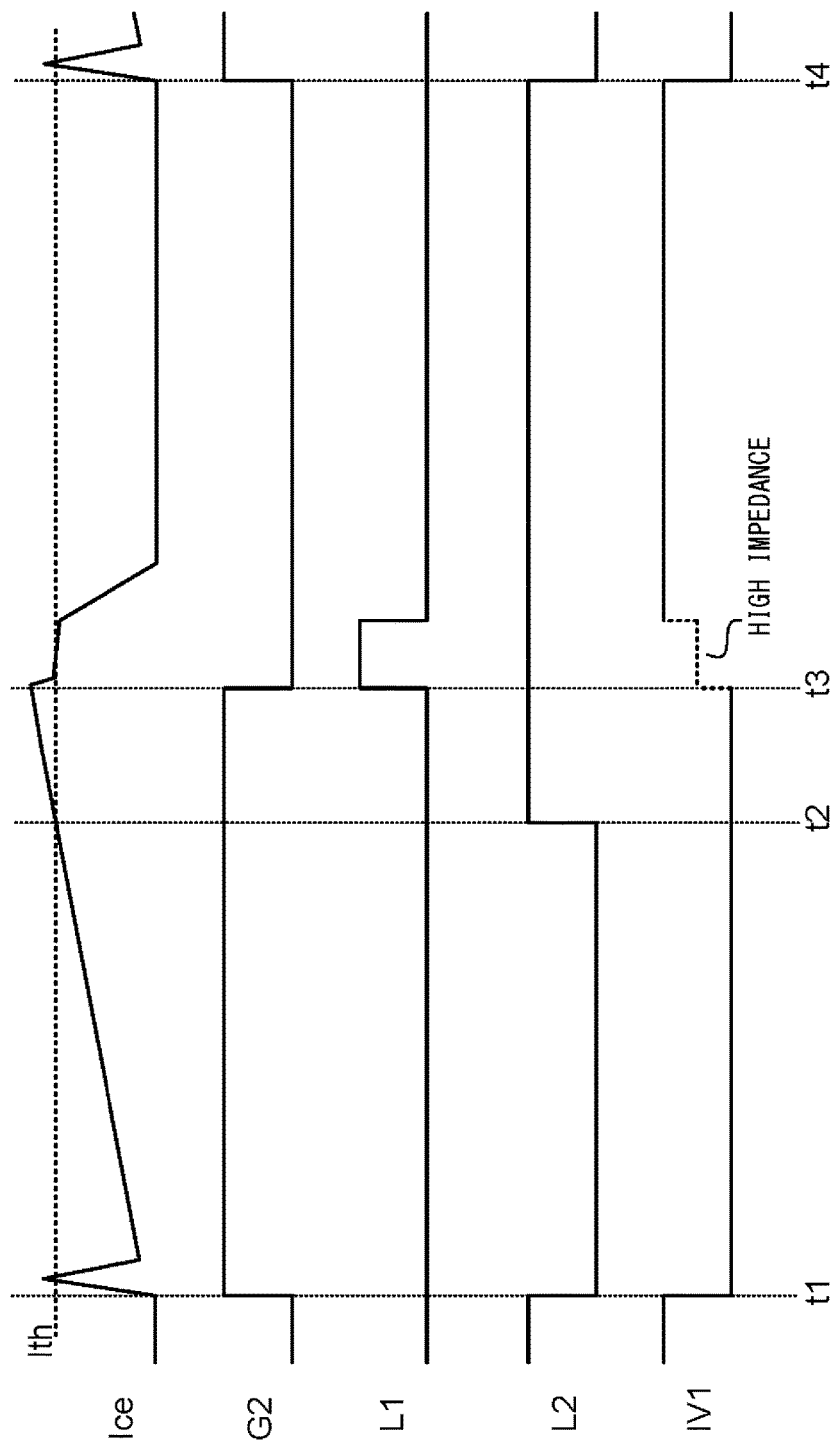
FIG. 2 is a timing chart of switching control according to one embodiment of the present invention (when an overcurrent is detected)

First, suppose that, when the first gate signal G1 turns on the MOS transistor M1, the second gate signal G2 turns from low level to high level (time point t1 in FIG. 2). Then, the output L1 of the two-level circuit 3 is at low level, and thus the output (control signal) of the AND circuit 4 is at low level. Accordingly, the three-state inverter 2 is in the enabled state, and thus the second gate signal G2 is inverted by the three-state inverter 2 to yield a low-level output IV1, which is fed to the gate of the MOS transistor M2. This turns off the MOS transistor M2, and turns on the switching devices Q1 and Qs.

Here, due to a reverse recovery current generated by an unillustrated diode externally fitted to the switching device Qs and due to a disparity of the current through the switching device Qs relative to the switching device Q1, noise in the form of an instantaneous rise occurs in the current through the resistor R1. When the noise occurs, the voltage that results from the conversion by the resistor R1 exceeds the reference voltage Vr2 for over current detection, and thus a pulse that instantaneously turns to high level occurs in the output of the comparator 7. By being triggered by a turn of the second gate signal G2 from low level to high level, the filter 8 masks the output of the comparator 7 for a predetermined time, and the just-mentioned pulse is thus masked.

In this way, the masked signal is fed to the latch circuit 9, and thus the output L2 of the latch circuit 9 is not latched at high level. That is, it is possible to prevent latching from occurring with timing different from the timing with which an overcurrent is supposed to be detected.

Then, with the switching device Q1 in an On-state, the collector current Ice increases gradually, and when it exceeds a threshold current Ith at a time point t2, the current detection signal detected by the resistor R1 exceeds the reference voltage Vr2, and accordingly the output of the comparator 7 turns to high level. Now, this output is not masked by the filter 8, but is fed, as it is, to the latch circuit 9. The output L2 of the latch circuit 9 is then latched at high level. In this way, an overcurrent is detected.

Thereafter, at a time point t3 when the first gate signal GI turns off the MOS transistor M1 and the second gate signal G2 turns from high level to low level, by being triggered by the turn of the second gate signal G2, the two-level circuit 3 outputs a high-level output L1 for a predetermined time. Here, the output L2 of the latch circuit 9 is latched at high level, and thus the output (control signal) of the AND circuit 4 has a high impedance. Accordingly, the output IV1 of the three-state inverter 2 has a high impedance. Even when the collector current Ice decreases to or below the threshold current Ith and as a result the output of the comparator 7 turns to low level, the latch circuit 9 still latches its output at high level.

Here, the output of the AND circuit 4 is inverted by the inverter 5, and thus the control signal of the error amplifier 6 turns to low level. Accordingly, the error amplifier 6 enters the enabled state. Thus, the voltage at the node between the MOS transistors M1 and M2 is controlled to be equal to the reference voltage Vr1. Then, when the output L1 of the two-level circuit 3 turns to low level, the output of the AND circuit 4 turns to low level, and thus the error amplifier 6 outputs a high impedance. Accordingly, the three-state inverter 2 enters the enabled state, and thus the second gate signal G2 is inverted to yield a high-level output IV1, which is fed to the MOS transistor M2.

Figure 8:
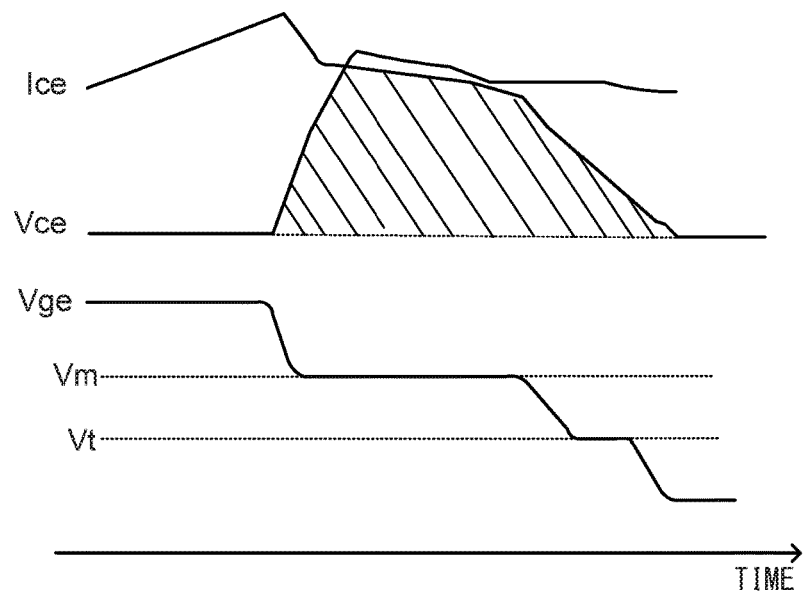
FIG. 8 is a timing chart of another example of conventional turn-off control.

Here, the reference voltage Vr1 corresponds to a voltage Vm shown in FIG. 8, and thus, as shown in FIG. 8, a gate-emitter voltage Vge of the switching device Q1 drops initially to the voltage Vr1 and then, after the lapse of a predetermined time, it drops further to a threshold voltage Vt of the switching device Q1, and eventually to the ground potential of the gate driver 100. Thus, as shown in FIG. 8, when the switching device Q1 turns off, a rise due to a surge voltage in the collector-emitter voltage Vce can be suppressed.

Thereafter, at a time point t4 when the second gate signal G2 turns from low level to high level, the latch circuit 9 unlatches.

Figure 3:
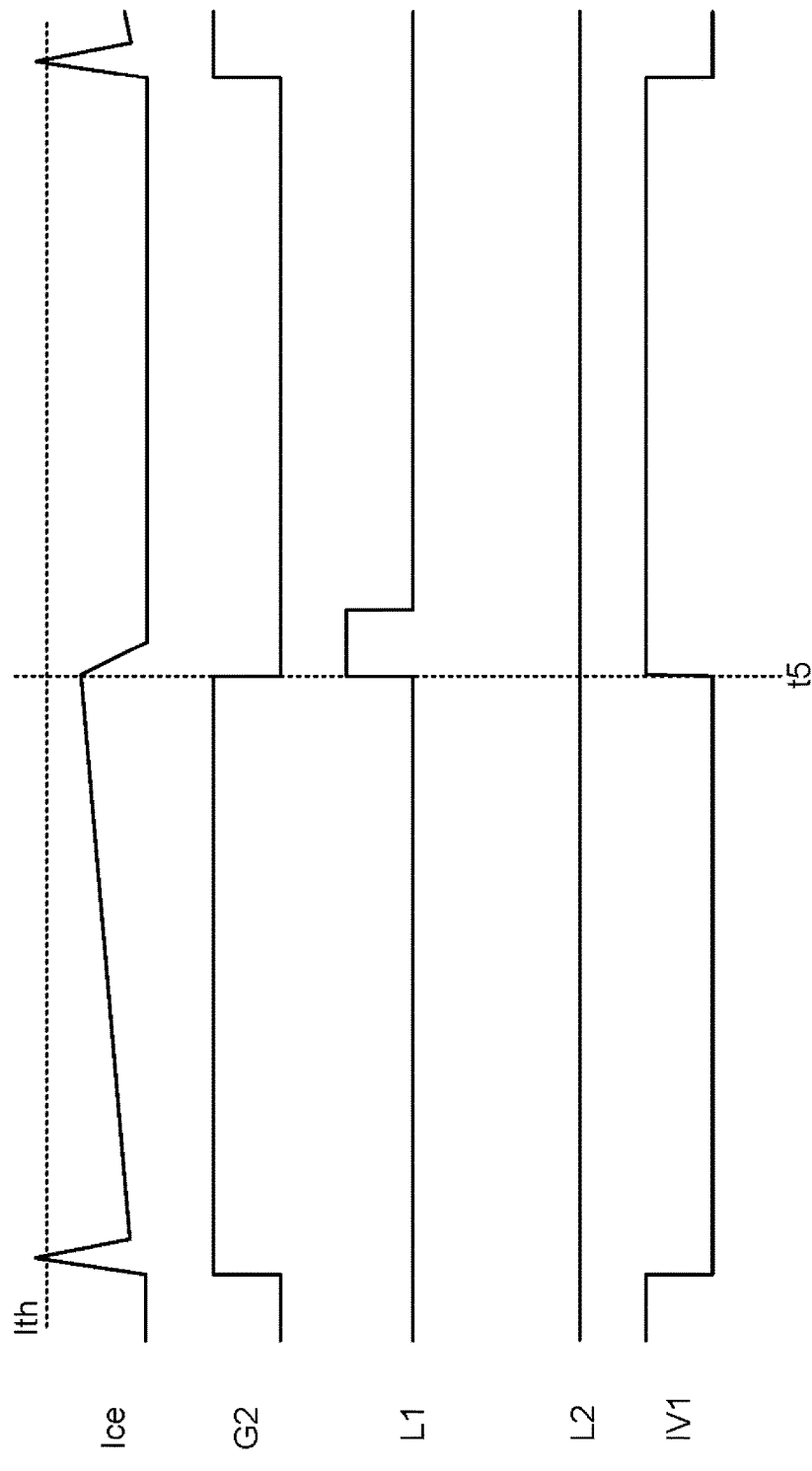
FIG. 3 is a timing chart of switching control according to one embodiment of the present invention (when no overcurrent is detected)

On the other hand, the timing chart shown in FIG. 3 shows a case where no overcurrent occurs. In this case, with the switching device Q1 in an On state, the collector current Ice increases but does not exceed the threshold current Ith, and thus no overcurrent occurs. Accordingly, the latch circuit 9 does not latch the output L2 at high level, and thus even when, at a time point t5 when the second gate signal G2 turns from high level to low level, the output L1 of the two-level circuit 3 turns to high level for a predetermined time, the output of the AND circuit 4 remains at low level. Accordingly, the three-state inverter 2 is in the enabled state, and thus it inverts the second gate signal G2 to yield a high level, which is fed, as the output IV1 of the three-state inverter 2, to the MOS transistor M2.

Figure 7:
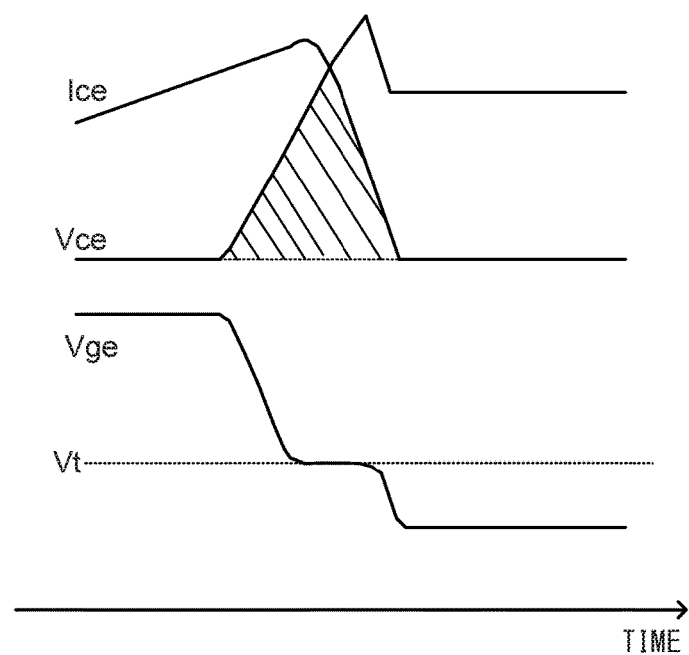
FIG. 7 is a timing chart of one example of conventional turn-off control.

With this configuration, as shown in FIG. 7, the gate-emitter voltage Vge of the switching device Q1 exhibits a behavior in which it drops to the threshold voltage Vt, and thereafter drops further to the ground potential of the gate driver 100. Here, no overcurrent occurs, and thus no rise as shown in FIG. 7 due to a surge voltage occurs in the collector-emitter voltage Vce. An overlap between the collector-emitter voltage Vce and the collector current Ice is small, and thus switching loss can be suppressed.

As described above, in this embodiment, when an overcurrent occurs, it is possible to suppress a rise due to a surge voltage that may occur when the switching device Q1 turns off; in addition, in normal operation free from an overcurrent, it is possible to suppress switching loss that may occur when the switching device Q1 turns off.

Figure 4:
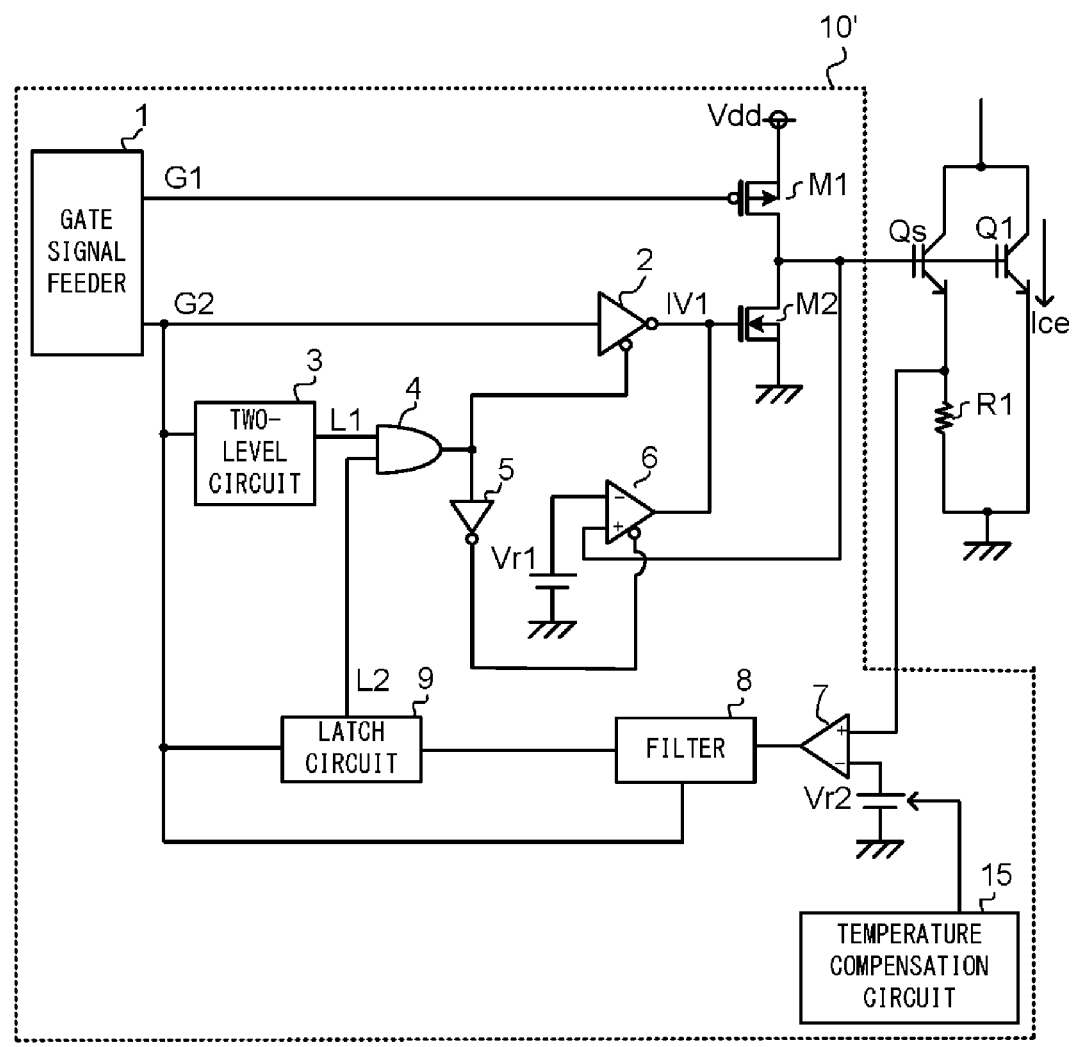
FIG. 4 is a diagram showing a circuit configuration of a gate driver according to a modified example of the present invention.

The circuit configuration of the gate driver according to a modified example of the above-described embodiment is shown in FIG. 4. The gate driver 10' shown in FIG. 4 differs from the gate driver 10 shown in FIG. 1 in being provided with a temperature compensation circuit 15.

The temperature compensation circuit 15 is a circuit that changes the reference voltage Vr2 according to a measured temperature. Thus, even when the level of the current detection signal produced by the switching device Qs and the resistor R1 varies due to change in temperature, it is possible to properly change the reference voltage Vr2. The temperature compensation circuit 15 may be configured to change the level of, instead of the reference voltage Vr2, the current detection signal fed to the comparator 7.

Figure 5:
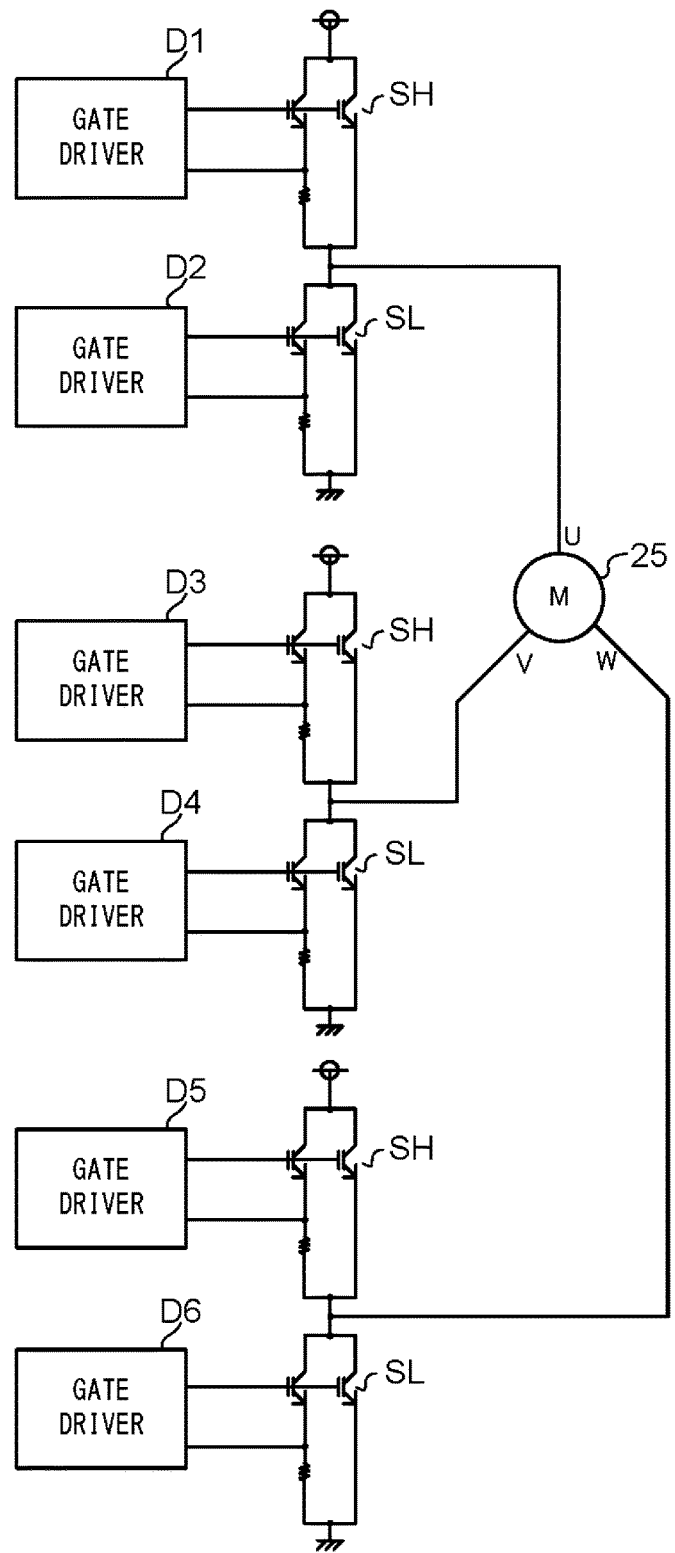
FIG. 5 is a diagram showing a configuration of a motor driving device according to one embodiment of the present invention.
Figure 6:
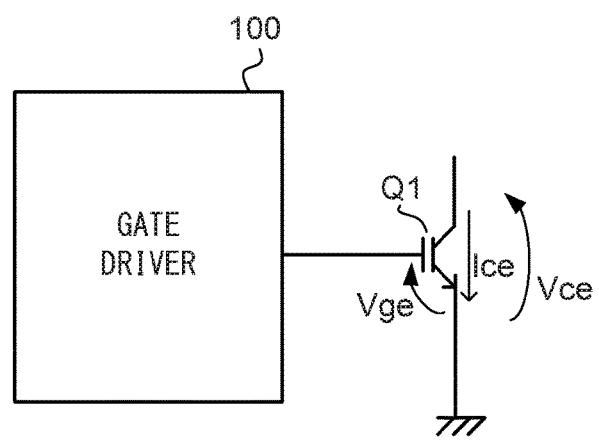
FIG. 6 is a diagram showing a configuration of a conventional switch drive.

An example in which the gate driver according to the present embodiment is applied to a motor driving device is shown in FIG. 5. The motor driving device 20 shown in FIG. 5 is for driving a three-phase motor 25, and is provided with pairs of bridge circuit segments comprising upper-side switching devices SH and lower-side switching devices SL, individually for the U-phase, V-phase, and W-phase of the three-phase motor 25, and gate drivers D1 to D6. Each of the gate drivers D1 to D6 can have a configuration similar to that of the gate driver previously described.

The gate driver according to the present embodiment is applicable not only to motor driving devices but also to, for example, DC/AC converters and the like.

While some embodiments of the present invention have been described above, they allow for many modifications and variations within the spirit of the present invention.

For example, instead of the filter 8 provided for reducing noise which occurs when the switching device Q1 turns on, a low-pass filter which is configured so as to eliminate the noise itself can be provided on the input side of the comparator 7, to which the current detection signal is fed.

For another example, for detecting the collector current Ice passing through the switching device Q1, a resistor connected in series with the switching device Q1 can be used; however, seeing that, depending on the level of the collector current Ice, the resistor can produce much heat, the switching device Qs is preferred.

Moreover, the driving target of the gate driver is not limited to an IGBT, but may instead be another type of switching device such as a MOSFET or the like.

What is claimed is:

1. A switch drive circuit for driving a switching device, comprising:
   an overcurrent detector which detects an overcurrent passing through the switching device; and
   a voltage controller which applies a control voltage to the switching device to control the switching device between On and Off states,
   wherein,
   when the overcurrent detector detects an overcurrent, the voltage controller applies to the switching device a control voltage that initially drops to a predetermined voltage higher than a threshold voltage of the switching device and that then, after a lapse of a predetermined time, drops further to a ground potential of the switch drive circuit to turn off the switching device, and
   when the overcurrent detector detects no overcurrent, the voltage controller applies to the switching device a control voltage that drops, before the lapse of the predetermined voltage, to a ground potential of the switch drive circuit to turn off the switching device.

2. The switch drive circuit of claim 1, further comprising:
   an upper-side switching device and a lower-side switching device connected in series between a supply voltage and a ground potential, a control terminal of the switching device being connected to a node between the upper-side and lower-side switching devices,
   wherein
   the voltage controller includes:
   the lower-side switching device;
   a drive signal feeder which outputs a drive signal for driving the lower-side switching device;
   a signal feeder which feeds a signal based on the drive signal fed thereto to the lower-side switching device; and
   a constant voltage controller which controls such that a voltage at the node is equal to the predetermined voltage,
   wherein
   according to a result of detection by the overcurrent detector, the signal feeder is switched between enabled and disabled states and the constant voltage controller is switched between enabled and disabled states.

3. The switch drive circuit of claim 2, wherein the signal feeder is a three-state inverter.

4. The switch drive circuit of claim 2, wherein
the constant voltage controller includes:
an error amplifier to which the voltage at the node and a reference voltage are fed; and
the lower-side switching device to a control terminal of which an output of the error amplifier is fed.

5. The switch drive circuit of claim 2, wherein
the voltage controller further includes:
a two-level circuit which outputs a high level for a predetermined time by being triggered by the drive signal feeder turning the drive signal to a level for turning on the lower-side switching device; and
an AND circuit to which a detection signal resulting from detection by the overcurrent detector and an output of the two-level circuit are fed,
wherein
according to an output of the AND circuit, the signal feeder is switched between the enabled and disabled states and the constant voltage controller is switched between the enabled and disabled states.

6. The switch drive circuit of claim 1, wherein
the overcurrent detector includes:
a comparator to which a detection signal resulting from detection of a current passing through the switching device and a reference voltage are fed; and
a latch circuit to which an output of the comparator is fed.

7. The switch drive circuit of claim 6, wherein
a filter which masks the output of the comparator for a predetermined time when the switching device turns on is arranged at a stage preceding the latch circuit.

8. The switch drive circuit of claim 6, further comprising:
a temperature compensator which changes the reference voltage or a level of the detection signal according to a measured temperature.

9. The switch drive circuit of claim 1, wherein
a current detection signal detected by a circuit segment that comprises a second switching device and a resistor connected in series and that is connected in parallel with the switching device is fed to the overcurrent detector.

10. The switch drive circuit of claim 1, wherein
the switching device comprises an IGBT (insulated-gate bipolar transistor).

11. A motor driving device comprising the switch drive circuit of claim 1 and a switching device driven by the switch drive circuit.

* * * * *